United States Patent
Liu et al.

(10) Patent No.: US 7,537,048 B2
(45) Date of Patent: *May 26, 2009

(54) INTEGRATED LIQUID COOLING SYSTEM FOR ELECTRONIC COMPONENTS

(75) Inventors: Tay-Jian Liu, Guangdong (CN); Chih-Hao Yang, Guangdong (CN); Chao-Nien Tung, Guangdong (CN); Chuen-Shu Hou, Guangdong (CN)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 385 days.

This patent is subject to a terminal disclaimer.

(21) Appl. No.: 11/308,276

(22) Filed: Mar. 15, 2006

(65) Prior Publication Data

US 2007/0034359 A1 Feb. 15, 2007

(30) Foreign Application Priority Data

Aug. 10, 2005 (CN) .................. 2005 1 0036549

(51) Int. Cl.
*H05K 7/20* (2006.01)
(52) U.S. Cl. ............... 165/104.33; 165/80.4; 257/714; 361/699
(58) Field of Classification Search ............... 165/80.4, 165/104.33; 257/714; 361/699
See application file for complete search history.

(56) References Cited

U.S. PATENT DOCUMENTS

| 6,894,899 | B2 * | 5/2005 | Wu et al. ..................... 361/699 |
| 7,114,551 | B2 * | 10/2006 | Matsushita et al. ......... 165/80.4 |
| 7,219,714 | B1 * | 5/2007 | Heydari ..................... 165/80.4 |
| 7,222,661 | B2 * | 5/2007 | Wei et al. ................... 165/80.4 |
| 7,249,625 | B2 * | 7/2007 | Duan ........................ 165/80.4 |
| 7,251,137 | B2 * | 7/2007 | Iijima et al. ................. 361/699 |
| 7,262,967 | B2 * | 8/2007 | Crocker et al. .............. 361/699 |
| 7,325,591 | B2 * | 2/2008 | Duan et al. ............. 165/104.33 |
| 7,379,301 | B2 * | 5/2008 | Liu et al. .................... 361/699 |
| 2005/0077028 | A1 * | 4/2005 | Oikawa ..................... 165/80.4 |
| 2006/0185830 | A1 * | 8/2006 | Duan ..................... 165/104.33 |

FOREIGN PATENT DOCUMENTS

CN 2622866 Y 6/2004

* cited by examiner

*Primary Examiner*—Leonard R Leo
(74) *Attorney, Agent, or Firm*—Winston Hsu

(57) ABSTRACT

An integrated liquid cooling system (100) includes a heat absorbing member (10), a heat dissipating member (20) and a pump (15). The heat absorbing member defines therein a fluid flow channel (115) for passage of a coolant and a pump receiving housing (120) adjacent to the fluid flow channel. The heat dissipating member is mounted to and maintained in fluid communication with the heat absorbing member. The pump is received in the pump receiving housing of the heat absorbing member. The pump is configured for driving the coolant to circulate through the heat absorbing member and the heat dissipating member. The heat absorbing member, the heat dissipating member and the pump of the liquid cooling system are combined together to form an integrated structure without utilizing any connecting pipes.

7 Claims, 4 Drawing Sheets

INTEGRATED LIQUID COOLING SYSTEM FOR ELECTRONIC COMPONENTS

CROSS-REFERENCES TO RELATED APPLICATION

Relevant subject matter is disclosed in two copending U.S. patent applications filed on the same date and each having a same title with the present application, which are assigned to the same assignee with this patent application.

FIELD OF THE INVENTION

The present invention relates generally to a cooling device, and more particularly to a liquid cooling system with an integrated structure. The liquid cooling system can be suitably applied for removing heat from heat generating electronic components.

DESCRIPTION OF RELATED ART

Along with fast developments in electronic information industries, electronic components such as central processing units (CPUs) of computers are made to be capable of operating at a much higher frequency and speed. As a result, the heat generated by the CPUs during their normal operations is commensurately increased. The generated heat, if not timely removed away from the CPUs, may cause them to become overheated and finally affect the workability and stability of the CPUs. In order to remove the heat of the CPUs and hence to maintain the CPUs to work normally, cooling devices must be provided to the CPUs to dissipate heat therefrom. Conventionally, extruded heat sinks combined with electric fans are frequently used for this heat dissipation purpose. However, these conventional cooling devices prove ineffective and unsatisfactory to cool down the current high speed CPUs.

In recent years, liquid cooling systems have been proposed to remove heat from the current high speed CPUs. As a more effective cooling device, the liquid cooling system generally includes a pump, a heat absorbing member and a heat dissipating member. In practice, these components are connected together in series by a plurality of pipes or fittings so as to form a heat transfer loop through which a coolant is circulated. The heat absorbing member is maintained in thermal contact with a CPU for absorbing the heat generated by the CPU. The liquid cooling system employs the coolant circulating through the heat transfer loop so as to bring the heat of the CPU from the heat absorbing member to the heat dissipating member for dissipation. Under the drive of the pump, the coolant as cooled down in the heat dissipating member, is sent back to the heat absorbing member for being available again for heat absorption from the CPU.

The liquid cooling system still has the following drawbacks. Since the pump, the heat absorbing member and the heat dissipating member are connected together by a large number of pipes or fittings, it is difficult to make the resultant liquid cooling system to have a compact structure. The requirement of the large number of pipes or fittings also adds assembly complexity to the liquid cooling system and raises the chance of liquid leakage at the joints between the pipes and the components (i.e., the pump, the heat absorbing member and the heat dissipating member) of the liquid cooling system. In application, mounting of the liquid cooling system will be a tiresome and time-consuming work since the components of the liquid cooling system are required to be addressed individually. Similarly, if the liquid cooling system is desired to be demounted for purposes of repair or replacement, the components of the liquid cooling system are also required to be individually demounted.

Therefore, it is desirable to provide a liquid cooling system which overcomes the foregoing disadvantages.

SUMMARY OF INVENTION

The present invention relates to a liquid cooling system for removing heat from a heat generating component. The liquid cooling system includes a heat absorbing member, a heat dissipating member and a pump. The heat absorbing member is used for thermally contacting the heat generating component. The heat absorbing member defines therein a fluid flow channel for passage of a coolant and a pump receiving housing adjacent to the fluid flow channel. The heat dissipating member is mounted to and maintained in fluid communication with the heat absorbing member. The pump is received in the pump receiving housing of the heat absorbing member. The pump is used for driving the coolant to circulate through the heat absorbing member and the heat dissipating member. In the present liquid cooling system, the components thereof, i.e., the heat absorbing member, the heat dissipating member and the pump, are combined together to form an integrated structure without utilizing any connecting pipes or fittings.

Other advantages and novel features of the present invention will become more apparent from the following detailed description of preferred embodiment when taken in conjunction with the accompanying drawings, in which:

DETAILED DESCRIPTION

Figure 1:
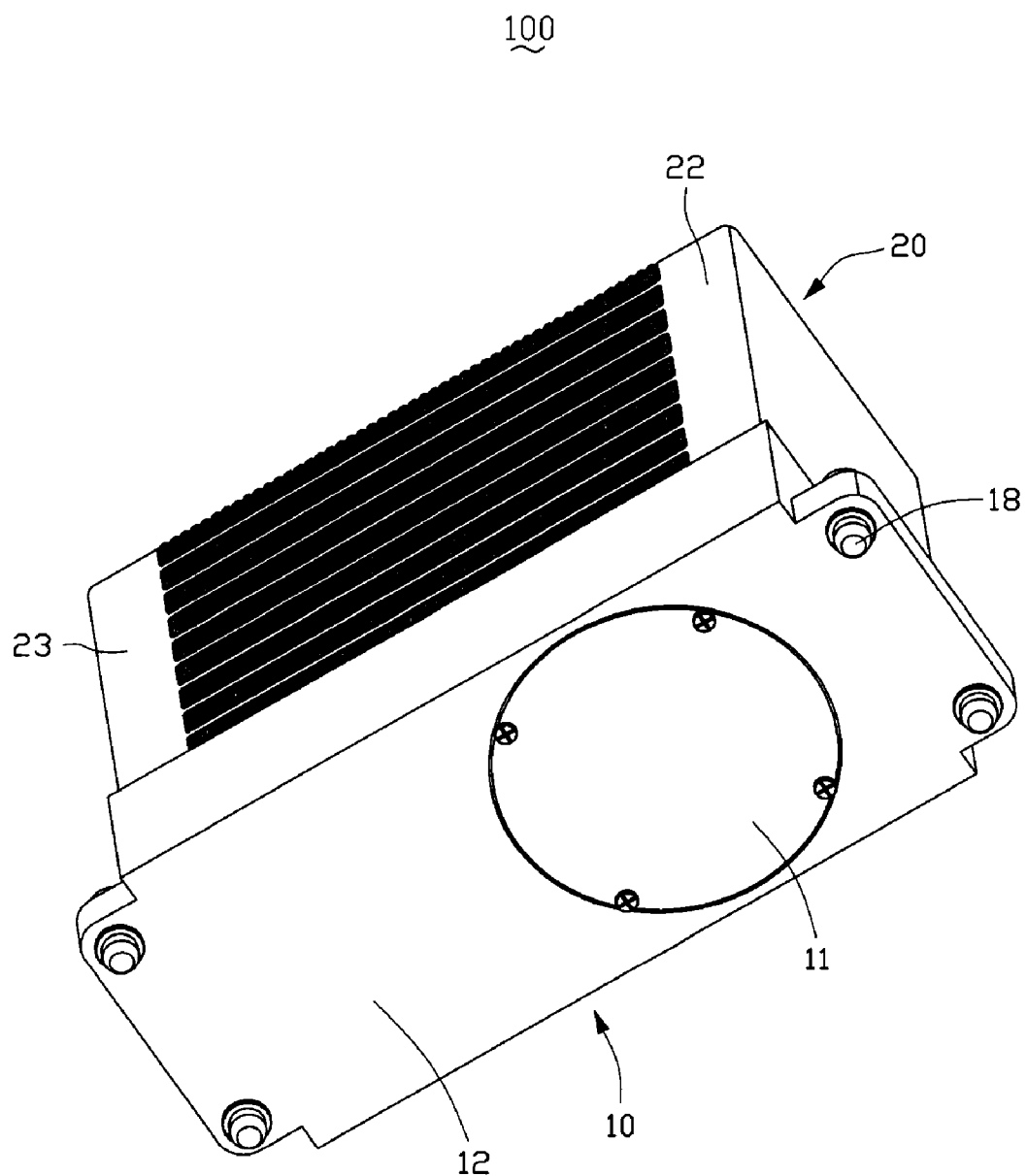
FIG. 1 is an isometric view of a liquid cooling system in accordance with one embodiment of the present invention.
Figure 2:
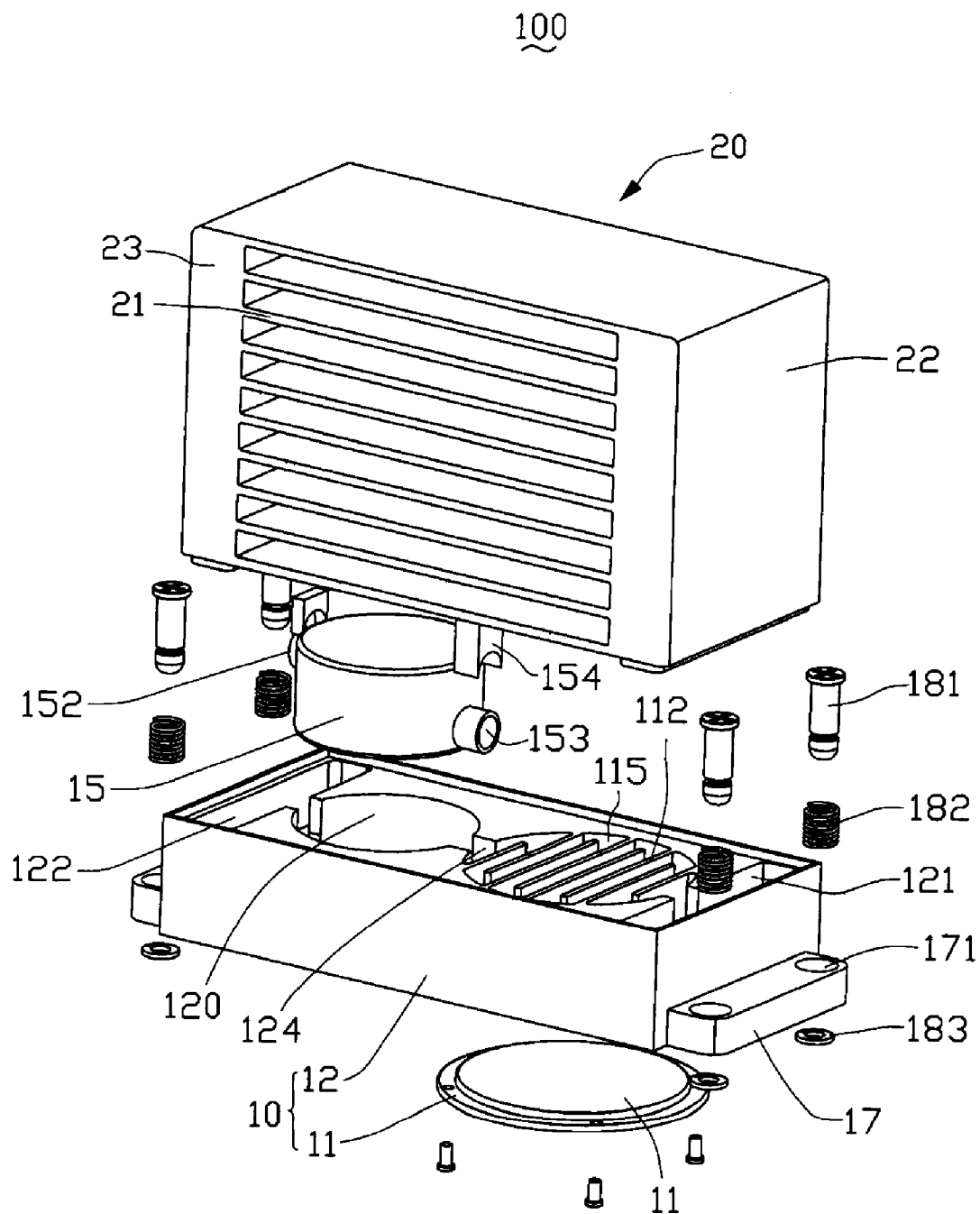
FIG. 2 is an exploded, isometric view of the liquid cooling system of FIG. 1.
Figure 3:
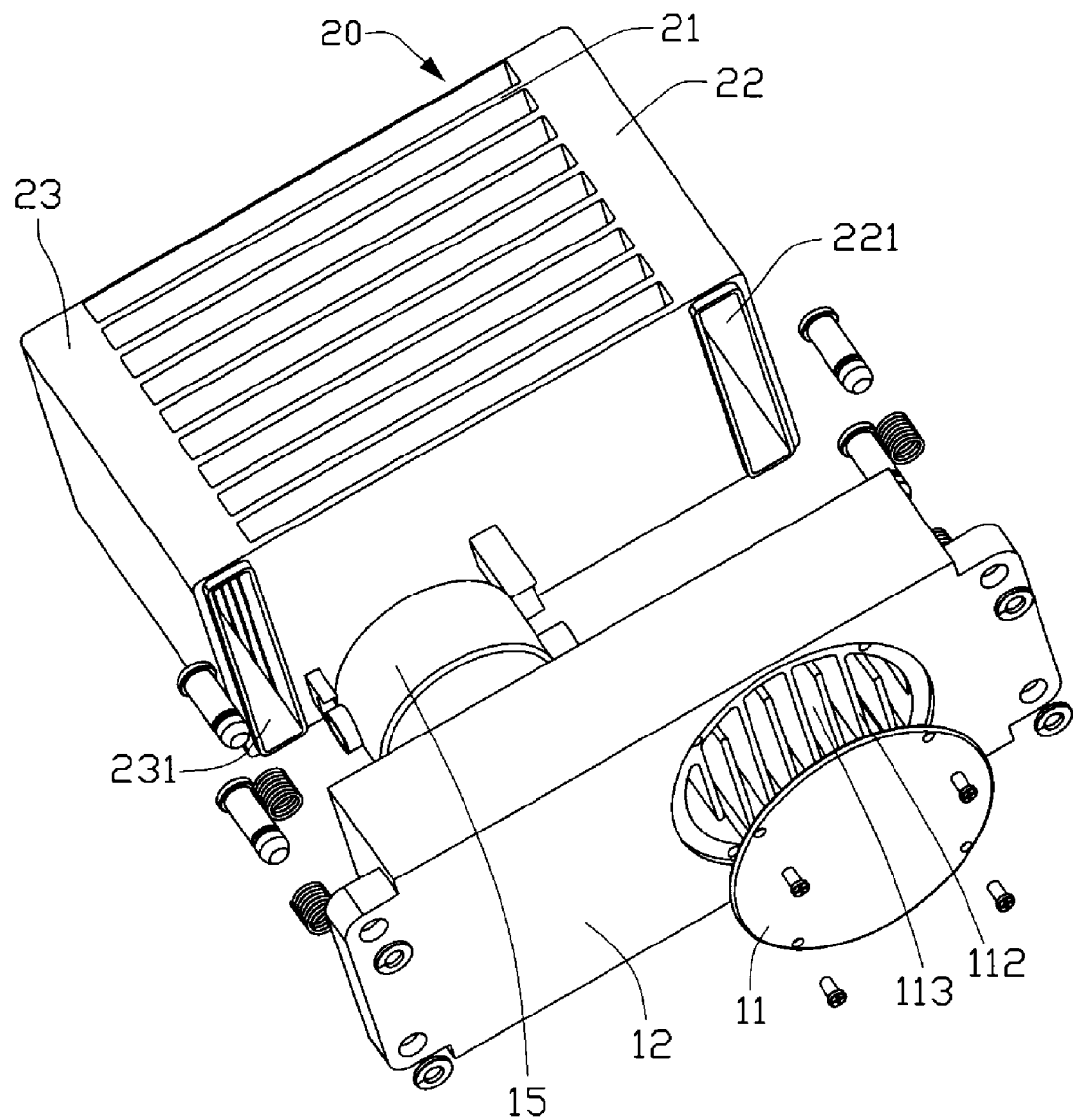
FIG. 3 is similar to FIG. 2, but viewed from another aspect.

FIGS. 1-3 illustrate a liquid cooling system 100 in accordance with one embodiment of the present invention. The liquid cooling system 100 has an integrated structure, which includes a heat absorbing member 10, a pump 15 and a heat dissipating member 20.

The heat absorbing member 10 includes a heat absorbing plate 11 and a supporting base 12 to which the heat dissipating member 20 is supportively mounted. The heat absorbing plate 11 is adopted for thermally contacting a heat generating component (not shown) such as a central processing unit (CPU) of a computer. The heat absorbing plate 11 is made independently of the supporting base 12 and typically is made of highly thermally conductive material such as copper or aluminum. In order to lower down the total manufacturing cost for the heat absorbing member 10, the supporting base 12 is preferably made of plastic material by methods such as injection molding.

A portion of the supporting member 12 is formed to have a plurality of partition plates 112, which are arranged in parallel with each other with an elongated slot 113 being defined between every adjacent two partition plates 112, as shown in FIG. 3. This portion has a size substantially the same as that of the heat absorbing plate 11. These partition plates 112 are so designed that, after the absorbing plate 11 is attached to a bottom of the supporting base 12 to seal an underside of each of the slots 113 defined between these partition plates 112, a fluid flow channel 115 having a plurality of turns is continuously formed by the slots 113 for passage of a coolant such as water therethrough to absorb the heat generated by the heat generating component, as shown in FIG. 2. In this embodiment, the fluid flow channel 115 has a serpentine configuration. The absorbing plate 11 is attached to the supporting base 12 by a plurality of screws (not labeled), although other methods such as gluing or injection molding are also suitable.

The supporting base 12 defines therein a pump receiving housing 120. The pump receiving housing or cavity 120, which is used for receiving the pump 15 therein, is located adjacent to the fluid flow channel 115 of the heat absorbing member 10. The supporting base 12 further defines a pair of recesses, i.e., first recess 121 and second recess 122, at two opposite sides thereof. The first recess 121, as located closer to the fluid flow channel 115, is fluidically connected with the fluid flow channel 115 by a connecting passage (not labeled) defined in the supporting base 12 between the fluid flow channel 115 and the first recess 121. Similarly, the second recess 122, as located closer to the pump receiving housing 120, is maintained in fluid communication with the pump 15, which in turn is fluidically connected with the fluid flow channel 115. Specifically, the pump 15 has an inlet 152 and an outlet 153 at opposite sides thereof, respectively. After the pump 15 is fixedly received in the pump receiving housing 120, the inlet 152 and outlet 153 thereof are respectively captured in a pair of cutouts 124 defined in the supporting base 12, near two opposite sides of the pump receiving housing 120, respectively. A pair of sealing means 154 is utilized to fixedly maintain the inlet 152 and outlet 153 in the cutouts 124 and meanwhile to seal the pump receiving housing 120 from the fluid flow channel 115 and the second recess 122. Thus, the fluid flow channel 115 and the second recess 122 are fluidically connected together by way of the pump 15.

The supporting base 12 has a pair of flanges 17 extends outwardly from the longitudinal sides thereof, respectively. Each flange 17 defines therein a pair of mounting holes 171 each for receiving a fastener 18 used for securing the liquid cooling system 100 to the computer in which the heat generating component such as CPU is mounted. The fastener 18 includes a pin 181, a spring 182 and a washer 183.

Figure 4:
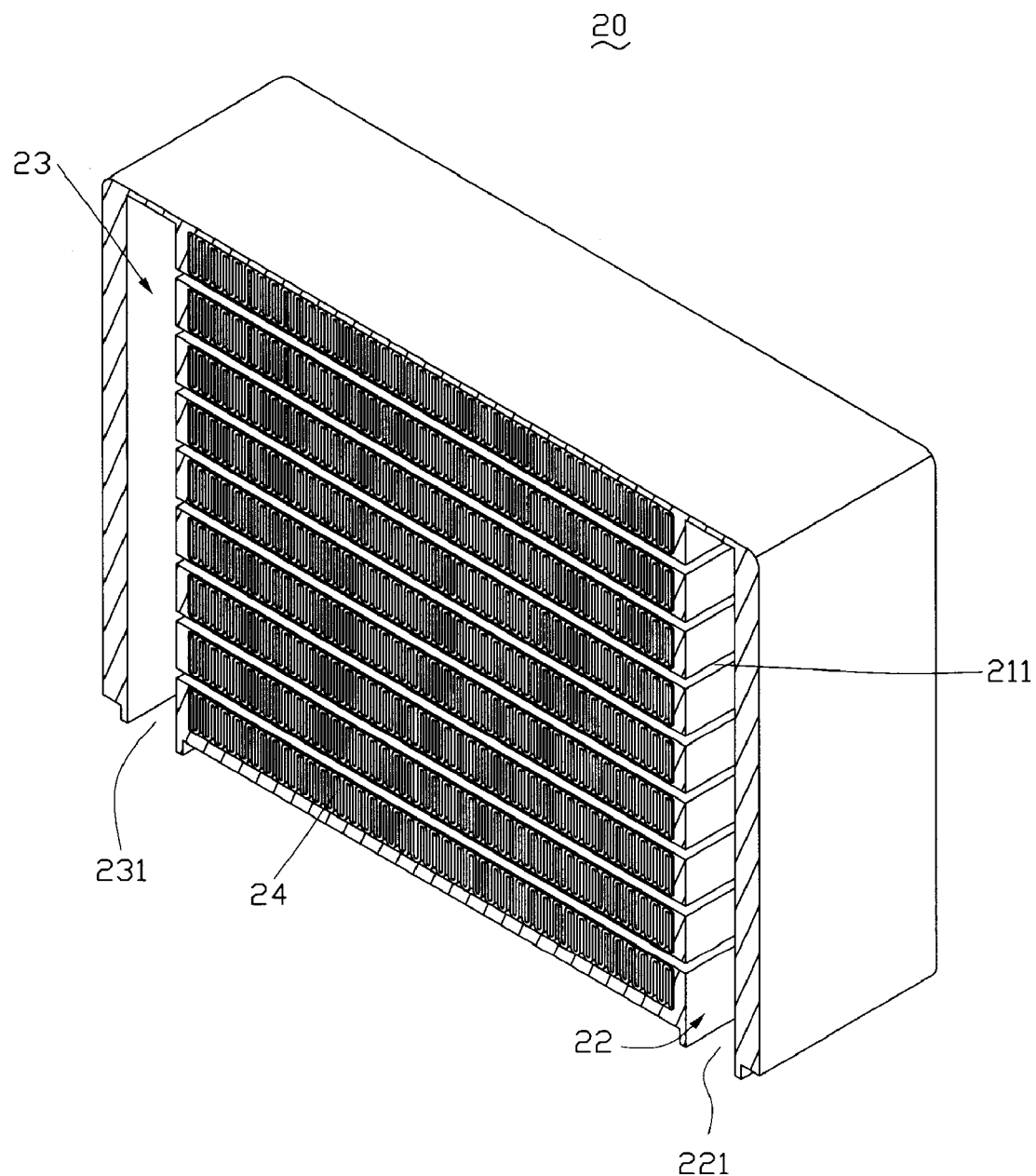
FIG. 4 is a sectioned isometric view of a heat dissipating member of the liquid cooling system of FIG. 1.

The heat dissipating member 20 includes a plurality of connecting conduits 21 disposed in parallel with each other and first, second fluid reserve housings 22, 23 located at respective opposite sides of these connecting conduits 21, and a fin member 24 sandwiched between every adjacent two connecting conduits 21. The fin member is maintained in thermal contact with the corresponding connecting conduits 21. With reference to FIG. 4, each of the connecting conduits 21 defines therein a fluid passage 211, which is connected with the first and second fluid reserve housings 22, 23. The first and second fluid reserve housings 22, 23 are used to reserve a predetermined quantity of the coolant in the liquid cooling system 100 and operate to allocate the coolant reserved therein evenly over the fluid passages 211 of the connecting conduits 21. The first fluid reserve housing 22 has an opening 221 at a bottom thereof. The opening 221 has a size substantially the same as that of the first recess 121 of the supporting base 12. Similarly, the second fluid reserve housing 23 has an opening 231 at a bottom thereof and the opening 231 has a size substantially the same as that of the second recess 122 of the supporting base 12. In particular, the openings 221, 231 are so dimensioned that, when the heat dissipating member 20 is mounted to the supporting base 12, the first and second fluid reserve housings 22, 23 are hermetically connected with the first and second recesses 121, 122 of the supporting base 12, respectively. That is, the heat dissipating member 20 is mounted to the supporting base 12 in a press-fit manner. Alternatively, gaskets or similar devices may be used during assembly of the heat dissipating member 20 to the supporting base 12 in order to maintain a good sealing effect.

After the heat dissipating member 20 is assembled to the heat absorbing member 10, the components (i.e., the heat absorbing member 10, the heat dissipating member 20 and the pump 15) of the liquid cooling system 100 are maintained in fluid communication with each other. Accordingly, a heat transfer loop is established inside the liquid cooling system 100. In operation, the heat absorbing plate 11 of the heat absorbing member 10 is maintained in thermal contact with the heat generating component such as CPU of the computer to which the liquid cooling system 100 is applied. As passing through the fluid flow channel 115 of the heat absorbing member 10, the coolant receives the heat generated by the CPU. Under the driving of the pump 15, the coolant flows towards the heat dissipating member 20 where the heat of the coolant is released. Particularly, the heat of the coolant is taken away by the fin members 24 of the heat dissipating member 20 as the coolant flows through the fluid passages 211 of the connecting conduits 21. Thereafter, the coolant as cooled down is sent back to the fluid flow channel 115, whereby the heat of the CPU is continuously removed away as the coolant is continuously circulated through the heat transfer loop of the liquid cooling system 100.

In the present liquid cooling system 100, the heat absorbing member 10, the heat dissipating member 20 and the pump 15 are connected together without utilizing any pipes or fittings. The components of the liquid cooling system 100 can be assembled easily to form an integrated and compact structure, as shown in FIG. 1. Since no connecting pipes are required, the liquid leakage problem associated with the pipe connections is also eliminated. By addressing a limited number of the fasteners 18, the liquid cooling system 100 as a whole can be easily mounted to the computer in which the CPU is installed for removing heat from the CPU, and can be easily demounted from the computer for repair or maintenance.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A liquid cooling system comprising:
   a heat absorbing member defining therein a fluid flow channel for passage of a coolant;
   a heat dissipating member mounted to the heat absorbing member, the heat dissipating member including first and second housing members arranged separately and a plurality of conduits fluidically connected between the first and second housing members, the first and second housing members each being in fluid communication with the fluid flow channel of the heat absorbing member; and
   a pump received in the heat absorbing member and configured for driving the coolant to circulate through said fluid flow channel, said first and second housing members and said conduits;
   wherein the heat absorbing member further defines therein a cavity adjacent to the fluid flow channel for receiving the pump therein;

wherein the first and second housing members are located at opposite sides of the heat dissipating member, respectively, and a fin member is sandwiched between at least two adjacent conduits; and wherein the heat absorbing member defines therein first and second recesses corresponding to the first and second housing members of the heat dissipating member, and the first and second housing members are fluidically connected with the first and second recesses, respectively.

2. The liquid cooling system of claim 1, wherein the fluid flow channel has a serpentine configuration.

3. The liquid cooling system of claim 1, wherein the heat dissipating member is mounted to the heat absorbing member in a press-fit manner.

4. The liquid cooling system of claim 1, wherein the heat absorbing member includes a supporting base providing support for the heat dissipating member and a heat absorbing plate adapted for contacting a heat generating component.

5. The liquid cooling system of claim 4, wherein the heat absorbing plate is made of metal material and the supporting base is made of non-metal material.

6. The liquid cooling system of claim 5, wherein the fluid flow channel is formed by a plurality of slots, the slots being defined by a plurality of partition plates formed on the supporting base.

7. The liquid cooling system of claim 1, wherein the fluid flow channel is formed by a plurality of slots, the slots being defined by a plurality of partition plates formed on the heat absorbing member.

* * * * *